United States Patent
Chou et al.

(10) Patent No.: US 8,220,144 B2
(45) Date of Patent: Jul. 17, 2012

(54) METHOD FOR IMPROVING AN ELECTROMAGNETIC BANDGAP STRUCTURE

(75) Inventors: Chia-Hsing Chou, Taipei (TW); Chih-Wei Tsai, Taipei (TW)

(73) Assignee: ASUSTeK Computer Inc., Taipei (TW)

( * ) Notice: Subject to any disclaimer, the term of this patent is extended or adjusted under 35 U.S.C. 154(b) by 888 days.

(21) Appl. No.: 12/273,519

(22) Filed: Nov. 18, 2008

(65) Prior Publication Data
US 2009/0135570 A1 May 28, 2009

(30) Foreign Application Priority Data
Nov. 27, 2007 (TW) ............................. 96144976 A (51) Int. Cl.
*H05K 3/30* (2006.01)
(52) U.S. Cl. ............... 29/832; 29/830; 29/831; 29/846; 29/847; 29/852
(58) Field of Classification Search ............... 29/846, 29/847, 849, 852, 857, 860, 863, 832, 831; 29/593; 361/800, 816, 818, 277, 281; 257/595, 257/600, 602, 295; 333/167, 185, 202, 12; 174/261, 264, 262, 360; 324/207.13, 207.11, 324/207.12, 207.22, 517
See application file for complete search history.

(56) References Cited

U.S. PATENT DOCUMENTS

| | | | | |
|---|---|---|---|---|
| 3,846,755 A | * | 11/1974 | Hart | 382/206 |
| 6,949,707 B1 | * | 9/2005 | Tonomura | 174/390 |
| 7,030,463 B1 | * | 4/2006 | Subramanyam et al. | 257/595 |
| 7,215,007 B2 | | 5/2007 | McKinzie, III et al. | |
| 2003/0020567 A1 | * | 1/2003 | Chappell et al. | 333/204 |
| 2006/0092093 A1 | | 5/2006 | Choi et al. | |
| 2007/0090398 A1 | | 4/2007 | McKinzie, III | |

FOREIGN PATENT DOCUMENTS
TW 200642558 12/2006
* cited by examiner

*Primary Examiner* — A. Dexter Tugbang
*Assistant Examiner* — Tai Nguyen
(74) *Attorney, Agent, or Firm* — Jianq Chyun IP Office (57) ABSTRACT

A method for improving EBG (electromagnetic bandgap) structures is provided. First, a multi-layer board having at least one EBG unit is provided. Then, a maximum input impedance of the EBG unit under a predetermined frequency band is measured, in which a frequency corresponding to the maximum input impedance is a resonance frequency, and a capacitance is determined based on the resonance frequency. Besides, a minimum input impedance of the EBG unit is measured, and a logarithmic value corresponding to the maximum input impedance and a logarithmic value corresponding to the minimum input impedance are obtained so as to determine a resistance. Finally, an electronic device having the capacitance and the resistance is coupled to the EBG unit in parallel.

12 Claims, 7 Drawing Sheets

METHOD FOR IMPROVING AN ELECTROMAGNETIC BANDGAP STRUCTURE

CROSS-REFERENCE TO RELATED APPLICATION

This application claims the priority benefit of Taiwan application serial no. 96144976, filed on Nov. 27, 2007. The entirety of the above-mentioned patent application is hereby incorporated by reference herein and made a part of specification.

BACKGROUND OF THE INVENTION

1. Field of the Invention

The present invention relates to a method for improving EBG structures and a multi-layer board applying the same, which can form a bandgap covering a broadband frequency, so as to prevent generation of noises.

2. Description of Related Art

In a multi-layer circuit board, a power layer and a ground layer may form cavity resonators, such that in a high frequency application, noises may be generated in the power layer/ground layer and cause the power layer and the ground layer not to be equipotential surface. Namely, the noise may cause voltage variations at some positions of the power layer/ground layer. For example, when the ground layer is taken as a potential reference layer for signals or electronic devices, if the voltage variation of the potential reference layer exceeds a tolerance range, operations of the electronic devices or the circuit may be abnormal, and even an operation of the whole system may be abnormal.

Moreover, when a signal line is connected from a driver to a receiver, signals may be changed from one signal layer to another signal layer through a via. As such, the signals to be transmitted between layers may pass through the power layer and the ground layer.

If a frequency of the layer-changed signal is just a resonance frequency between the power layer and the ground layer, then the energy of such signal can be absorbed by the cavity resonators. The absorbed energy may form noises on the power layer/ground layer. Such noises may be transmitted through the whole power layer/ground layer to interfere with other signal lines that perform the signal layer change process, so that signal quality is decreased, and even a timing of the whole system goes failure, which may lead to abnormal operations of the system.

Presently, an electromagnetic bandgap (EBG) structure may be applied to resolve the aforementioned problems, in which a gandgap is designed to block the noises.

SUMMARY OF THE INVENTION

The present invention is directed to a method for improving EBG structures and a multi-layer board applying the same, in which a bandgap formed therein may cover a broadband frequency, so as to prevent generation of noises.

The present invention provides a method for improving EBG structures, which includes following steps. First, a multi-layer board having at least one EBG unit is provided. Then, a maximum input impedance of the EBG unit under a predetermined frequency band is measured, in which a frequency corresponding to the maximum input impedance is a resonance frequency and a capacitance is determined based on the resonance frequency. Besides, a minimum input impedance of the EBG unit is measured, and a logarithmic value corresponding to the maximum input impedance and a logarithmic value corresponding to the minimum input impedance are obtained to determine a resistance. Finally, an electronic element having the capacitance and the resistance is coupled to the EBG unit in parallel.

The present invention provides a multi-layer board structure applying the aforementioned EBG structure, the multi-layer board structure includes a first signal layer a second signal layer, a power layer located between the first signal layer and the second signal layer, a ground layer located between the first signal layer and the second signal layer, and at least one electronic device disposed on a surface of the first signal layer, in which the electronic device is electrically connected to the power layer and the ground layer through a first via and a second via, respectively. One of the power layer and the ground layer further has at least one EBG unit, and a disposed position of the electronic device relates to a position of the EBG unit.

The present invention provides a multi-layer board structure applying the aforementioned EBG structure, the multi-layer board structure includes a first signal layer a second signal layer, a power layer located between the first signal layer and the second signal layer, a ground layer located between the first signal layer and the second signal layer, and at least one electronic device embedded between the power layer and the ground layer, in which one of the power layer and the ground layer further has at least one EBG unit, and an embedded position of the electronic device relates to a position of the EBG unit.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

The present invention will now be described more fully with reference to the accompanying drawings, in which like reference numerals in the drawings denote like elements. It should be noted that the drawings are simplified and are not accurately proportional. Moreover, for sake of appropriateness and clarity, the directional terms used herein such as "top", "bottom", "left", "right", "on", "under", "above", "below", "lower", "front", "back", etc. are for the purpose of describing directions in the figures only and are not intended to be limiting of the invention.

In case of below 1 GHz, a present EBG structure is more likely to generate noises and has a problem of noise transmission. Therefore, an improved EBG structure and a method for improving the EBG structure are desired, in which a bandgap from a low frequency to a high frequency is formed to reduce the generation of the noises and provide a better power supply integrity for a digital signal system.

First Embodiment

In the first embodiment of the present invention, according to the improved EBG structure, a bandgap from the low frequency to the high frequency is formed, so as to reduce the generation of the noises and provide a better power supply integrity for the digital signal system.

Figure 1A:
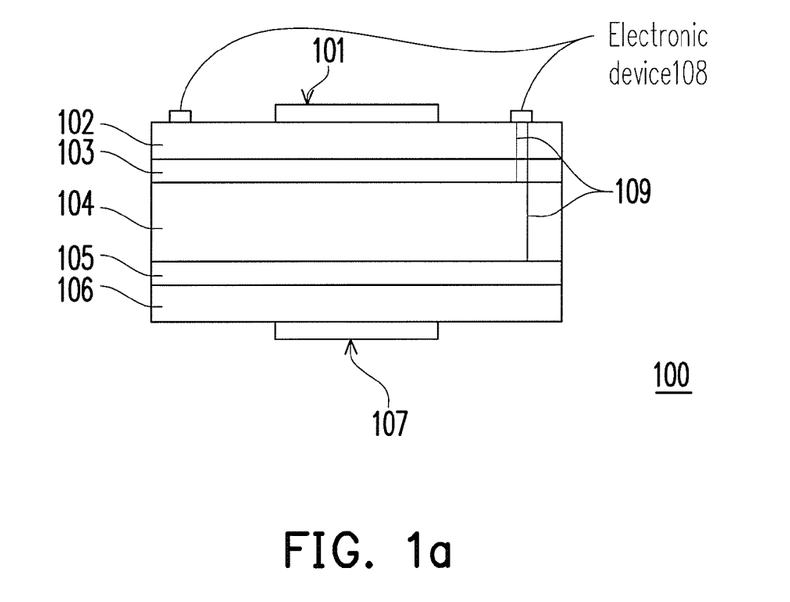
FIG. 1a is a cross-sectional view of a multi-layer board according to a first embodiment of the present invention.
Figure 1B:
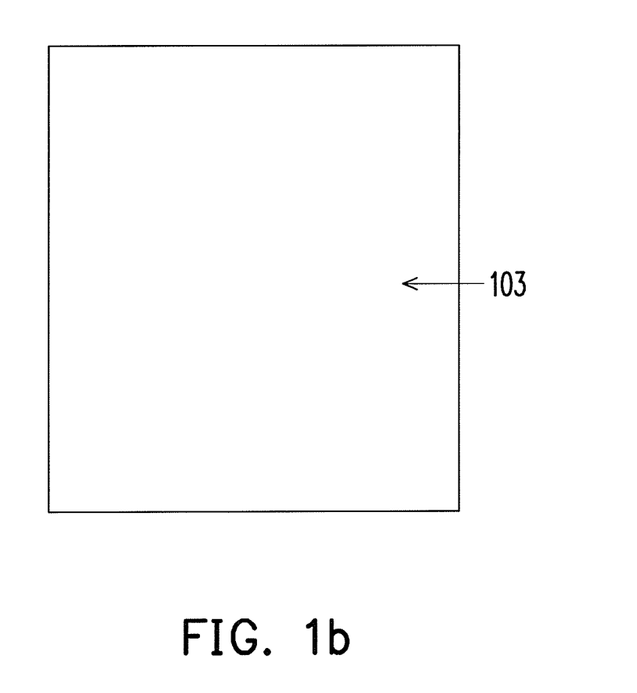
FIG. 1b is a schematic diagram of a ground layer of the multi-layer board.
Figure 1C:
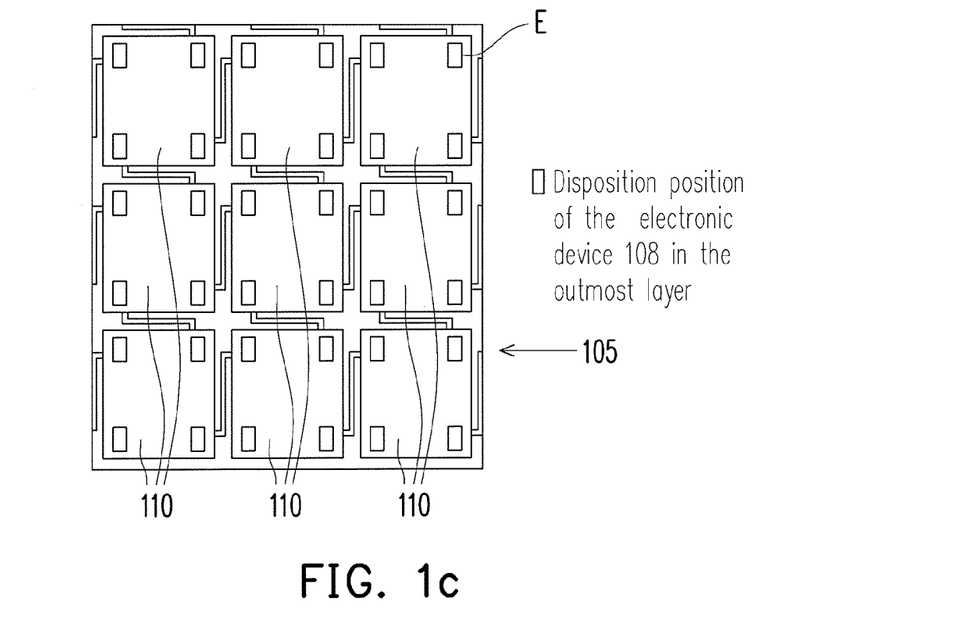
FIG. 1c is a schematic diagram of a power layer of the multi-layer board.
Figure 1D:
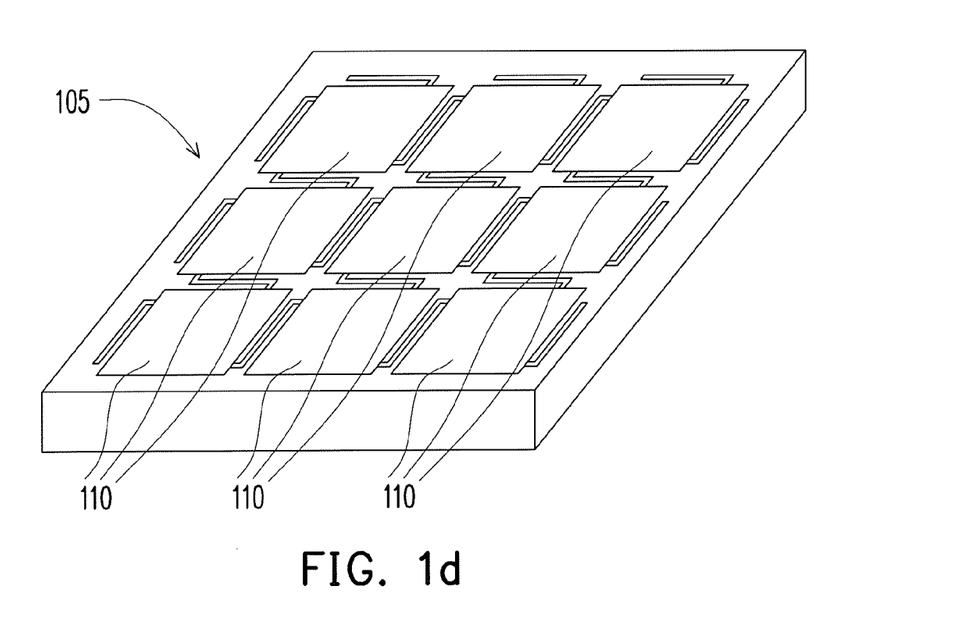
FIG. 1d is a schematic diagram of an EBG unit of the power layer of the multi-layer board.
Figure 1E:
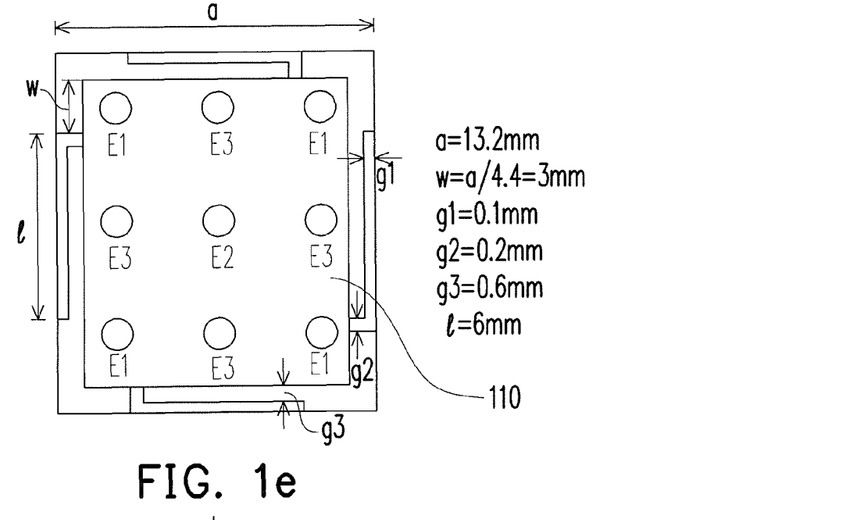
FIG. 1e is a magnified diagram of FIG. 1d.

FIG. 1a is a cross-sectional view of a multi-layer board according to a first embodiment of the present invention. FIG. 1b is a schematic diagram of a ground layer of the multi-layer board. FIG. 1c is a schematic diagram of a power layer of the multi-layer board. FIG. 1d is a schematic diagram of a power layer having an EBG unit. FIG. 1e is a magnified diagram of the EBG unit.

Referring to FIG. 1a~FIG. 1e, as shown in FIG. 1a, the 4-layer board 100 at least includes signal layers 101 and 107, a ground layer 103, a power player 105 and dielectric layers 102, 104 and 106. Arrangement of the layers is just an example, which is not limited by the present invention. Such multi-layer board structure can be applied to printed circuit board (PCB) and package structures.

Since the ground layer 103 is generally taken as a signal reference plane, in the present embodiment, the ground layer 103 is designed to be an integral plane as shown in FIG. 1b.

Since the ground layer 103 is taken as the signal reference plane, in the present embodiment, the EBG units are then formed on the power layer 105. Namely, the power layer 105 is etched with an EBG pattern. Certainly, those skilled in the art should understand that the power layer 105 can also be taken as the signal reference plane, and the EBG units can be formed on the ground layer 103.

As shown in FIG. 1c, a plurality of EBG units 110 is formed on the power layer 105. Here, the structure of the EBG unit 110 is not specifically limited. For example, a shape of the EBG unit can be a square. Referring to FIG. 1a and FIG. 1c, a symbol "E" represents a position to be coupled to an electronic device 108, and the electronic device 108 can be located at the outmost layer (i.e. the signal layer 101). The electronic device 108 can be electrically coupled to the ground layer 103 and the power layer 105 through a via 109. Namely, from a top view thereof, the position of the electronic device 108 of FIG. 1a just corresponds to the position E of FIG. 1c.

As shown in FIG. 1d, a dimension of the power layer 105 is designed to be 40 mm×40 mm and a shape of the EBG unit 100 is L-bridged, which are used herein as an example for illustration. However, those skilled in the art should understand that the present invention is not limited thereto. Dimension parameters of each EBG unit 110 are shown at right side of FIG. 1e, wherein a=13.2 mm, w=a/4.4=3 mm, g1=0.1 mm, g2=0.2 mm, g3=0.6 mm, l=6 mm.

In FIG. 1e, E1~E3 respectively represent relative positions of the electronic device, wherein E1 represents four corners of the EBG unit, E2 represents a center of the EBG unit, and E3 represents centers of four boundary lines of the EBG unit.

Basically, the electronic devices 108 are located corresponding to the four corners E1 of the EBG unit 110 to achieve a good overall effect. To further enhance the overall effect, more electronic devices 108 can be disposed corresponding to the center E2 and the centers E3 of the boundary lines of the EBG unit 110.

As described above, in the conventional multi-layer board having the EBG unit, the power layer and the ground layer may have a resonance phenomenon.

Since an equivalent circuit of the cavity resonator includes a plurality of capacitors connected in parallel, beside a serial resonance point of the individual capacitor, there are still parallel resonance points between two capacitors.

During the parallel resonance, an input impedance Z1 of the equivalent circuit of the cavity resonator becomes relatively large, which may cause failure of the system.

Since a parasitic resistance R of a general capacitor is rather small, there may be a relatively large parallel resonance phenomenon. On the other hand, the R value cannot be excessively large since the excessively large R value may lead to excessively large input impedance Z1.

Therefore, in the present embodiment, a suitable R value is selected. In the following content, how to select the R value to improve the EBG structure is described.

Figure 2:
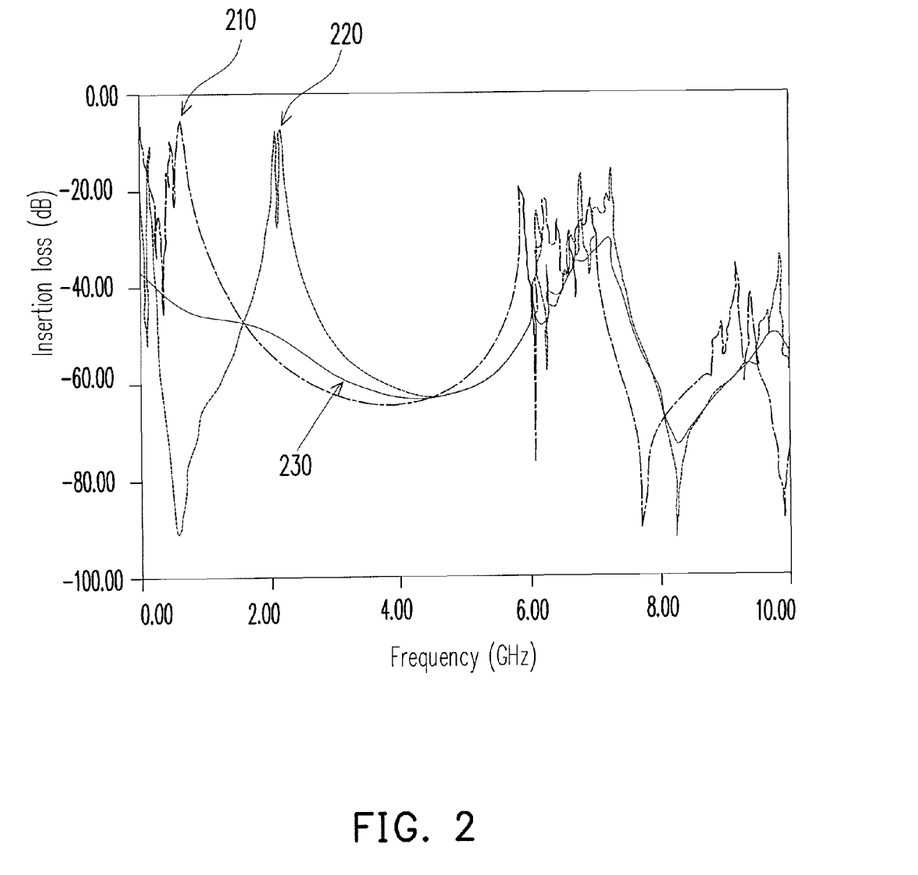
FIG. 2 is a characteristic curve diagram of insertion losses.

FIG. 2 is a characteristic diagram of insertion losses. The more the insertion loss is closed to 0 dB, the more liable the energy of such frequency is transmitted to another position. In case of below −30 dB, it represents the transmitted energy is rather small, and therefore −30 dB is generally utilized to select the bandwidth.

Figure 3:
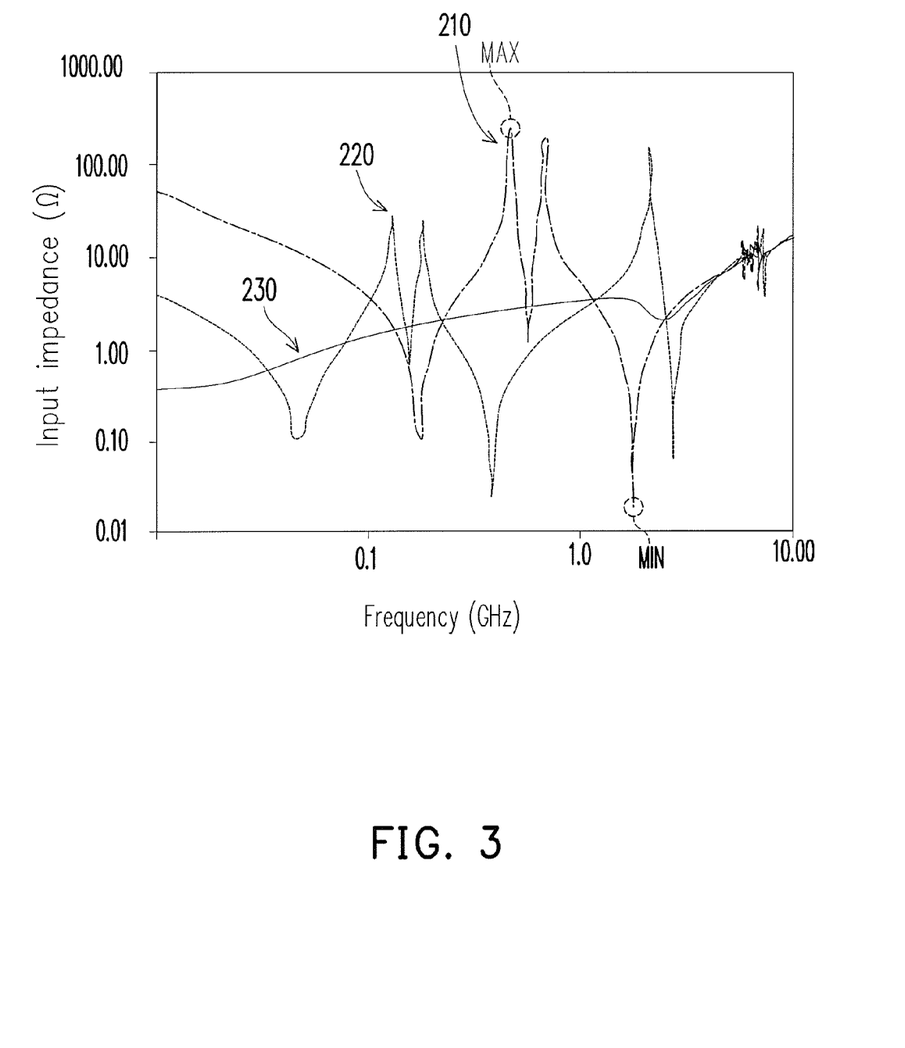
FIG. 3 is a characteristic curve diagram of input impedances.

FIG. 3 is a characteristic diagram of input impedances. The larger the input impedance is, the more liable the noise is generated.

Referring to FIG. 2 and FIG. 3, a curve 210 represents a result obtained based on the conventional EBG structure (a first conventional structure). A curve 220 represents a result obtained by combining general capacitors and the conventional EBG structure (a second conventional structure). Namely, in case of the curve 220, the capacitors are coupled to the conventional EBG structure, though suitable capacitances thereof are not selected. A curve 230 represents a result obtained based on the present embodiment (the electronic devices are coupled to suitable positions of the EBG units).

According to the curve 210 of FIG. 2 and FIG. 3, a maximum frequency of the first conventional structure is designed as, for example, 5.8 GHz, and an effective bandwidth thereof is designed as 4.8 GHz, though the noise below 1 GHz probably cannot be blocked. A frequency component of the digital signal is from a DC frequency to a knee frequency (Fknee) thereof. Therefore, in case of the first conventional structure, the frequency component of the digital signal is probably below 1 GHz, and now the energy carried by the digital signal is probably changed to a noise on the power layer or the ground layer. Namely, the present EBG structure is not suitable for the digital signal system.

According to the curve 220 of FIG. 2 and FIG. 3, effects of the second conventional structure are poor for either the input impedance or the insertion loss. For example, if a 1 nF capacitor (with a characteristic of equivalent resistance being 0.04 ohm and equivalent inductance being 0.5 nH) is inserted into the EBG unit, a bandgap will be formed between 2.5 GHz~6 GHz, which results in a worse effect. The bandgap (2.5 GHz~6 GHz) formed in the second conventional structure is less than the bandgap (1 GHz~5.8 GHz) formed in the first conventional structure, and is not liable to block the low frequency noise. Moreover, as to the input impedance, there is no help to just add capacitors, which can only lead to a shift phenomenon of the parallel resonance point.

According to the curve 230 of FIG. 2 and FIG. 3, it is obvious that effect of the present embodiment is optimal. In the present embodiment, suitable electronic devices are disposed on suitable positions E of the EBG units to obtain the optimal effect. In the present embodiment, the effective bandgap can be from nearly DC to 7 GHz, and therefore the effective frequency band thereof is 7 GHz. Within such frequency band, there is almost no interference of the noise. As shown by the curve 230 of FIG. 3, there is no large parallel resonance phenomenon for the input impedance thereof, and the parallel resonance point can be pressed down, so that the effect thereof is optimal.

As described above, if more electronic devices 108 are disposed, the insertion loss curve 230 of FIG. 3 can be further pressed down (i.e. the whole effect can be better).

Figure 1F:
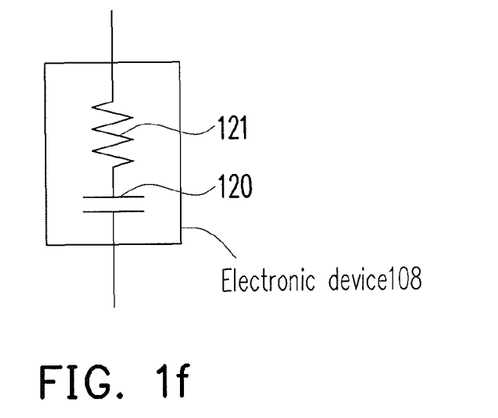
FIG. 1f and FIG. 1g are diagrams illustrating embodiments of an electronic device.
Figure 1G:
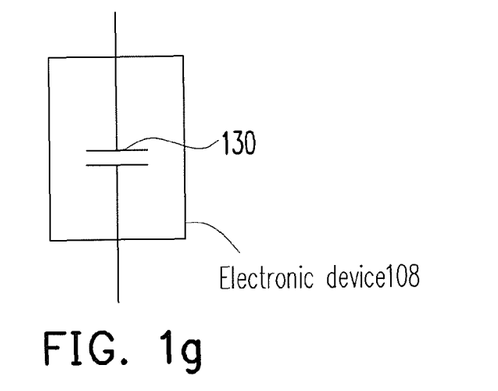

In the present embodiment, the electronic device 108 can be formed by connecting a capacitor 120 and a resistor 121 in serial, as shown in FIG. 1f. Alternatively, the resistor can be integrated into the capacitor. For example, a parasitic resistance or an equivalent serial resistance of a capacitor 130 can be designed to be the desired resistance, as shown in FIG. 1g.

In the following content, how to select a suitable capacitance for the electronic device 108 is described. First, a maximum value MAX of the input impedance (the curve 210 of FIG. 3) of the first conventional structure under a predetermined frequency band (for example, DC~10 GHz) is measured, wherein a frequency corresponding to the maximum input impedance MAX is regarded as the parallel resonance frequency. Next, the capacitance is determined according to the measured parallel resonance frequency. For example, when the parallel resonance frequency is 1 KHz~10 MHz, the capacitance can be 1 µF, and when the parallel resonance frequency is 10 MHz~200 MHz, the capacitance can be 100 nF. Namely, the higher the parallel resonance frequency is, the lower the capacitance is, and vice versa.

In the following content, how to select a suitable resistance for the electronic device 108 is described. First, a maximum and a minimum input impedance (the curve 210 of FIG. 3) of the first conventional structure are measured. Taking FIG. 3 as an example, the maximum input impedance MAX is 200 ohm, and the minimum input impedance MIN of the curve 210 is 0.02 ohm according to the curve 210.

Next, logarithmic values corresponding to the maximum input impedance MAX and the minimum input impedance MIN are respectively obtained, and a middle value of the two logarithmic values is regarded as the suitable resistance. According to the curve 210 of FIG. 3, such suitable resistance is 2 ohm. Namely, if the electronic device is implemented as shown in FIG. 1f, the resistance of the resistor 121 is about 2 ohm, and if the electronic device is implemented as shown in FIG. 1g, the parasitic resistance or the equivalent serial resistance of the capacitor 130 is 2 ohm. In an embodiment, the required resistance can further be obtained according to a following equation:

$$\text{Adaptive } R = 10^{\left(\frac{\log(max)-\log(min)}{2}+\log(min)\right)}$$

In the above equation, Adaptive R represents the required resistance. For example, MAX equals to 200 ohm, MIN equals to 0.02 ohm, and then Adaptive R equals to 2 ohm.

Those skilled in the art should understand that the obtained resistance can be varied within a certain range, and the results thereof still do not influence the insertion losses.

Figure 4:
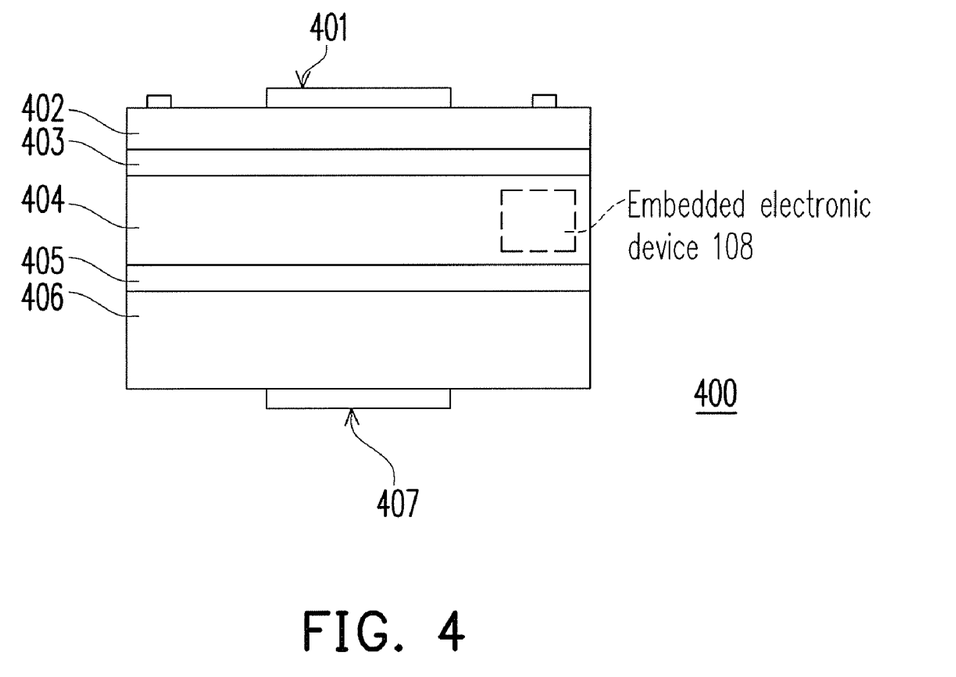
FIG. 4 is a cross-sectional view of another multi-layer board according to a first embodiment of the present invention.
Figure 5:
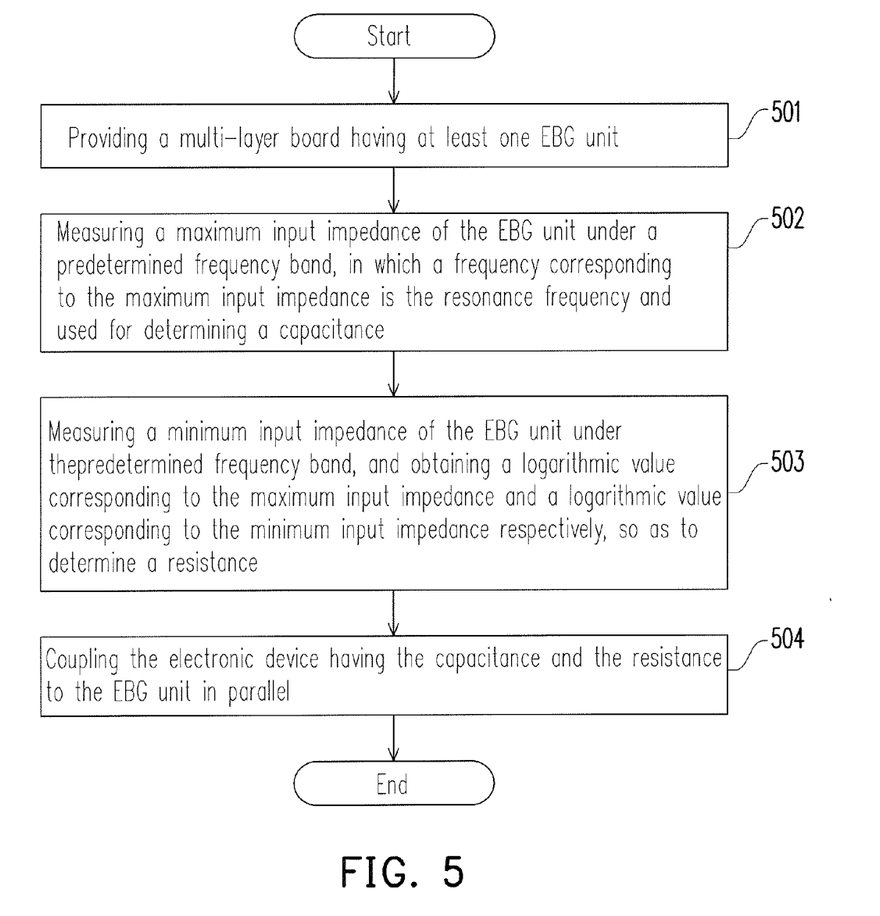
FIG. 5 is a flowchart illustrating a method for improving an EBG structure according to a second embodiment of the present invention.

Moreover, the electronic devices can also be embedded in the multi-layer board. FIG. 4 is a schematic diagram illustrating an electronic device embedded in the multi-layer board. As shown in FIG. 5, another type of 4-layer board 400 includes at least one signal layers 401 and 407, a ground layer 403, a power layer 405 and plurality of the dielectric layers 402, 404 and 406. An electronic device 408 can be embedded in the dielectric layer 404, which is located between the power layer 405 and the ground layer 403. Implementations of the electronic device 408 embedded in the dielectric layer 404 can be similar to those shown in FIG. 1f or FIG. 1g. Certainly, an embedding position thereof can also be the same as the positions E1~E3 shown in FIG. 1e.

Moreover, if the bandgap of the EBG unit is about to cover higher frequency band, a more complicated pattern for the EBG unit is required to be etched.

Second Embodiment

FIG. 5 is a flowchart illustrating a method for improving an EBG structure according to a second embodiment of the present invention. Referring to FIG. 5, in step 501, a multi-layer board having at least one EBG unit is provided. Structures of the multi-layer board and the EBG unit are, for example, similar to that of the aforementioned embodiment, and therefore detailed description thereof will not be repeated herein.

Next, in step 502, a maximum input impedance of the EBG unit under a predetermined frequency band (for example, DC~10 GHz) is measured, wherein a frequency corresponding to the maximum input impedance is regarded as the resonance frequency, and a capacitance is determined according to the measured resonance frequency. How to determine the capacitance according to the parallel resonance frequency is similar to that of the aforementioned embodiment, and therefore detailed description thereof will not be repeated herein.

In step 503, a minimum input impedance of the EBG unit under the predetermined frequency band is measured, and a logarithmic value corresponding to the maximum input impedance and a logarithmic value corresponding to the minimum input impedance are respectively obtained, so as to determine a resistance. How to determine the resistance is similar to that of the aforementioned embodiment, and therefore detailed description thereof will not be repeated herein.

In step 504, the electronic device having the capacitance and the resistance is coupled to the EBG unit in parallel. How to form such electronic device is similar to that of the aforementioned embodiment, and therefore detailed description thereof will not be repeated herein. Moreover, disposition position and disposing method of the electronic device are similar to that of the aforementioned embodiment, and therefore detailed description thereof will not be repeated herein.

According to the aforementioned embodiment, it is obvious that the embodiments of the present invention can surely improve the bandgap of the EBG structure for covering more frequency bands, so as to improve a noise blocking capability.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for improving an electromagnetic bandgap structure, comprising:
providing a multi-layer board having at least one electromagnetic bandgap unit;
measuring a maximum input impedance of the electromagnetic bandgap unit under a predetermined frequency band, wherein a frequency corresponding to the maximum input impedance is a resonance frequency, and a capacitance is determined based on the resonance frequency;
measuring a logarithmic value corresponding to a minimum input impedance of the electromagnetic bandgap unit under the predetermined frequency band and a logarithmic value corresponding to the maximum input impedance so as to determine a resistance; and
coupling an electronic device having the capacitance and the resistance to the electromagnetic bandgap unit in parallel.

2. The method for improving an electromagnetic bandgap structure as claimed in claim 1, wherein the step of coupling the electronic device having the capacitance and the resistance to the electromagnetic bandgap unit in parallel comprises:
providing a capacitor to serve as the electronic device, wherein the resistance is a parasitic resistance or an equivalent serial resistance of the capacitor.

3. The method for improving an electromagnetic bandgap structure as claimed in claim 1, wherein the step of coupling the electronic device having the capacitance and the resistance to the electromagnetic bandgap unit in parallel comprises:
providing a capacitor and a resistor connected in serial to serve as the electronic device.

4. The method for improving an electromagnetic bandgap structure as claimed in claim 1, wherein the multi-layer board comprises at least two signal layers, a power layer and a ground layer, and the step of providing the multi-layer board having at least one electromagnetic bandgap unit comprises:
forming the electromagnetic bandgap unit on one layer of the power layer and the ground layer; and
maintaining an integrity of another one layer of the power layer and the ground layer to serve as a signal reference layer.

5. The method for improving an electromagnetic bandgap structure as claimed in claim 4, wherein the step of coupling the electronic device having the capacitance and the resistance to the electromagnetic bandgap unit in parallel further comprises:
disposing the electronic device on a surface signal layer of the multi-layer board.

6. The method for improving an electromagnetic bandgap structure as claimed in claim 5, wherein in the step of coupling the electronic device having the capacitance and the resistance to the electromagnetic bandgap unit in parallel, a disposed position of the electronic device relates to a plurality of corners of the electromagnetic bandgap unit.

7. The method for improving an electromagnetic bandgap structure as claimed in claim 5, wherein in the step of coupling the electronic device having the capacitance and the resistance to the electromagnetic bandgap unit in parallel, a disposed position of the electronic device relates to a center of the electromagnetic bandgap unit.

8. The method for improving an electromagnetic bandgap structure as claimed in claim 5, wherein in the step of coupling the electronic device having the capacitance and the resistance to the electromagnetic bandgap unit in parallel, a disposed position of the electronic device relates to a plurality of centers of a plurality of boundary lines of the electromagnetic bandgap unit.

9. The method for improving an electromagnetic bandgap structure as claimed in claim 4, wherein the step of coupling the electronic device having the capacitance and the resistance to the electromagnetic bandgap unit in parallel further comprises:
embedding the electronic device between the power layer and the ground layer of the multi-layer board.

10. The method for improving an electromagnetic bandgap structure as claimed in claim 9, wherein in the step of coupling the electronic device having the capacitance and the resistance to the electromagnetic bandgap unit in parallel, an embedded position of the electronic device relates to a plurality of corners of the electromagnetic bandgap unit.

11. The method for improving an electromagnetic bandgap structure as claimed in claim 9, wherein in the step of coupling the electronic device having the capacitance and the resistance to the electromagnetic bandgap unit in parallel, an embedded position of the electronic device relates to a center of the electromagnetic bandgap unit or a plurality of centers of a plurality of boundary lines of the EBG electromagnetic bandgap unit.

12. The method for improving an electromagnetic bandgap structure as claimed in claim 9, wherein the step of measuring the logarithmic value corresponding to the minimum input impedance of the electromagnetic bandgap unit under the predetermined frequency band and the logarithmic value corresponding to the maximum input impedance so as to determine the resistance comprises:
determining the resistance according to a following equation:

$$\text{Adaptive } R = 10^{\left(\frac{\log(max)-\log(min)}{2}+\log(min)\right)},$$

wherein Adaptive R represents the resistance, MAX represents the maximum input impedance, and MIN represents the minimum input impedance.

* * * * *